(12) United States Patent
Kousaka et al.

(10) Patent No.: US 6,611,064 B1
(45) Date of Patent: Aug. 26, 2003

(54) SEMICONDUCTOR DEVICE AND METHOD FOR MANUFACTURING THE SAME

(75) Inventors: Takashi Kousaka, Tsukuba (JP); Naoya Suzuki, Tsukuba (JP); Toshiaki Tanaka, Tsukuba (JP); Masaaki Yasuda, Tsukuba (JP); Aizou Kaneda, Yokohama (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/744,577
(22) PCT Filed: Jul. 27, 1999
(86) PCT No.: PCT/JP99/04016
§ 371 (c)(1),
(2), (4) Date: Apr. 5, 2001
(87) PCT Pub. No.: WO00/07234
PCT Pub. Date: Feb. 10, 2000

(30) Foreign Application Priority Data

Jul. 28, 1998 (JP) .......................... 10/212696
Jul. 28, 1998 (JP) .......................... 10/212697

(51) Int. Cl.[7] .................. H01L 23/29; H01L 23/28; H01L 23/12
(52) U.S. Cl. .............. 257/787; 257/100; 257/433; 257/642; 257/643; 257/738; 257/778; 257/780; 257/781; 257/783; 257/788; 438/25; 438/26; 438/106; 438/118; 438/119; 438/126; 438/127
(58) Field of Search .................. 257/738, 778, 257/780, 783, 788, 781, 100, 433, 642, 643, 787; 438/25, 26, 118, 106, 119, 126, 127

(56) References Cited

U.S. PATENT DOCUMENTS

| 3,715,589 | A | * | 2/1973 | Ohoshima et al. .......... 250/367 |
| 4,985,478 | A | * | 1/1991 | Kameyama et al. ........ 523/219 |
| 5,122,858 | A | * | 6/1992 | Mahulikar et al. .......... 257/753 |

(List continued on next page.)

FOREIGN PATENT DOCUMENTS

| JP | 7273134 | 10/1995 |
| JP | 8055867 | 2/1996 |
| JP | 9089462 | 4/1997 |

OTHER PUBLICATIONS

Epoxies, Etc . . . , 50–3185 Thermally Conductive Potting and Encapsulating Resin, Copyright 1996–2001, www.epoxies.com, p. 2.*
NEC Corporation, Semiconductor Device Mount Manual, Copyright 1995–2001, www.ic.nec.co.jp/pkg/en/mount/3/3_1/3_1_3/cluck/index.html, Sections 3.1.2–3.1.3.*
University of Southern Mississippi (Department of Polymer Science, Differential Scanning Calorimetry, Copyright 1995, 1997, www.rsrc.usm.edu/macrog/dsc.htm.*

(List continued on next page.)

Primary Examiner—Amir Zarabian
Assistant Examiner—Ida M. Soward
(74) Attorney, Agent, or Firm—Antonelli, Terry, Stout & Kraus, LLP

(57) ABSTRACT

In the present invention, provided are a semiconductor device having a semiconductor-element-mounting substrate on which a semiconductor element has been mounted via an adhesive having an exothermic-reaction curing start temperature of 130° C. or below as measured with a differential scanning calorimeter at a heating rate of 10° C./minute, and a process for its fabrication.

3 Claims, 5 Drawing Sheets

U.S. PATENT DOCUMENTS

| | | | | |
|---|---|---|---|---|
| 5,134,462 A | * | 7/1992 | Freyman et al. | 257/688 |
| 5,173,766 A | * | 12/1992 | Long et al. | 257/687 |
| 5,300,459 A | * | 4/1994 | Ushikubo et al. | 438/126 |
| 5,473,512 A | * | 12/1995 | Degani et al. | 361/760 |
| 5,488,200 A | * | 1/1996 | Tsukada | 174/261 |
| 5,508,556 A | * | 4/1996 | Lin | 257/691 |
| 5,612,403 A | * | 3/1997 | Nguyen et al. | 524/440 |
| 5,643,998 A | * | 7/1997 | Nakano et al. | 525/103 |
| 5,667,884 A | * | 9/1997 | Bolger | 428/323 |
| 5,670,826 A | * | 9/1997 | Bessho et al. | 257/737 |
| 5,703,405 A | * | 12/1997 | Zeber | 257/777 |
| 5,734,201 A | * | 3/1998 | Djennas et al. | 257/783 |
| 5,736,789 A | * | 4/1998 | Moscicki | 257/774 |
| 5,741,446 A | * | 4/1998 | Tahara et al. | 264/109 |
| 5,767,580 A | * | 6/1998 | Rostoker | 257/737 |
| 5,773,895 A | * | 6/1998 | Hassan et al. | 257/774 |
| 5,783,866 A | * | 7/1998 | Lee et al. | 257/780 |
| 6,242,802 B1 | * | 6/2001 | Miles et al. | 257/738 |
| 2001/0009780 A1 | * | 7/2001 | Takeda et al. | 438/118 |

OTHER PUBLICATIONS

University of Southern Mississippi (Department of Polymer Science, The Glass Transition, Copyright 1995, 1996, 1997, www.rsrc.usm.edu/macrog/tg.htm.*

Akiyama et al., Chip Scale Packaging for Memory Devices, 1998, Hitachi, Ltd.*

Smith et al., Moisture Absorption Properties of Laminates Used in Chip Packaging Applications, AlliedSignal Laminate Systems, Inc., Mar. 11–13, 1997.* www.matweb.com, The Online Materials Information Resource (Data Availability), Copyright 1997–2001, www-.matweb.com/emptyfields.htm.*

* cited by examiner

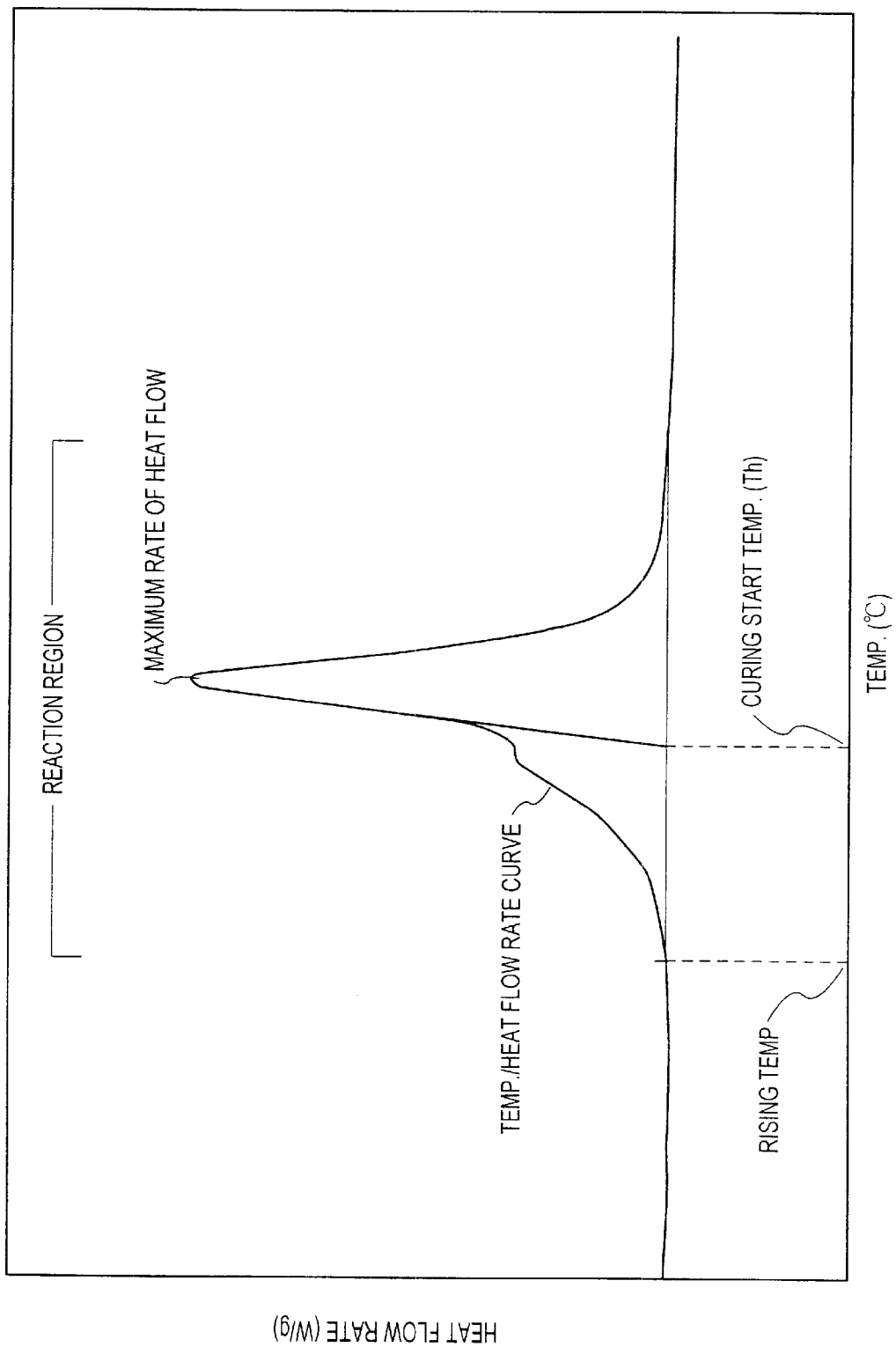

SEMICONDUCTOR DEVICE AND METHOD FOR MANUFACTURING THE SAME

TECHNICAL FIELD

This invention relates to a semiconductor device and a process for its fabrication.

BACKGROUND ART

In recent years, as a trend of semiconductors, their packaging in a higher density is being advanced. With this trend, the mainstream of semiconductor device packaging has shifted from through-hole mount packaging to surface-mount packaging. Also, the number of input/output terminals of a package is being made larger with an improvement in the degree of integration of semiconductors.

Hitherto, as typical surface-mount type semiconductor devices, QFP (quad flat package), for example, has been used which is a structure in which semiconductor elements are mounted on a metallic lead frame, the whole of the semiconductor element is encapsulated after gold wire bonding is carried out, and outer leads are cut and shaped and are put out from the sides of an encapsulated portion. However, in order to make this structure have terminals in a larger number, the terminal pitch must be made smaller. In a region with a pitch of 0.5 mm or smaller, a high-level technique is required for their connection to a mother board on which semiconductor elements are to be mounted. Accordingly, OMPAC (over-molded pad grid carrier) type BGA (ball grid array) where outer-face devices are arranged in array has been developed, and is being put into practical use.

This BGA enables arrangement of external terminals in a large number per unit area, and allows easy face-bonding mount onto the mother board, also enabling miniaturization with ease in comparison with the above-mentioned QFP.

An example of this OMPAC type BGA (hereinafter simply "BGA") is shown in FIG. 2. First, a semiconductor element 1 is fixed onto a semiconductor-element-mounting substrate 14 by means of an adhesive 3 or the like. Terminals on the semiconductor element 1 are electrically connected with gold-plated terminals 7 formed on the semiconductor-mounting substrate through gold wires 8. The semiconductor element 1 is further encapsulated with an organic insulating encapsulant 5. On an insulating base material 2, a metallic wiring pattern is incorporated which is electrically interconnected with a semiconductor element electrode. This metallic wiring pattern is constituted of fine wiring patterns 6 for transmitting electric signals. These are connected with external connecting terminals 9 through the insulating base material 2 on the back which is opposite to the side on which the semiconductor element is to be mounted. Also, in many cases, the fine wiring patterns 6 and the insulating base material 2 are covered with an insulating protective resist 4 at areas except for those of the region where the gold-plated terminals 7 are arranged for wire bonding and of the external terminals 9. Meanwhile, external terminals provided with solder balls in array are formed on the substrate. These are connected with external connecting terminals 9 through the insulating base material 2 on the back which is opposite to the side on which the semiconductor element is to be mounted. Also, in many cases, the fine wiring patterns 6 and the insulating base material 2 are covered with an insulating protective resist 4 at areas except for those of the region where the gold-plated terminals 7 are arranged for wire bonding and of the external terminals 9. Meanwhile, external terminals provided with solder balls in array are formed on the substrate.

In such a BGA device, members that occupy the greater part of the BGA's whole volume, except for those of the semiconductor element 1, fine wiring patterns 6, gold wires 8, gold-plated terminals 7 and solder balls 10, are organic materials, and hence these members absorb moisture during the storage of the device. For this reason, for example, as shown in FIG. 2, the moisture absorption water content may vaporize at a gap 13 formed between the semiconductor element 1 and the adhesive 3 to cause cracking or separation 11 in the interior of the insulating protective resist 4 embraced in the semiconductor-mounting substrate, or at the interface between the insulating protective resist 4 and the organic insulating encapsulating member 5 (at the interface between the insulating base material and the organic insulating encapsulating member 5 when the insulating protective resist 4 is not provided). Then, where this cracking or separation 11 has extended to the gold-plated terminals 7 for wire bonding as shown in FIG. 2, it may cause faulty electrical interconnection in the worst case.

DISCLOSURE OF THE INVENTION

The present invention provides a semiconductor device which may less cause cracking when mounted by soldering and can improve electrical interconnection reliability.

The semiconductor device of the present invention comprises;

(A) a semiconductor-element-mounting substrate having an insulating base material on which a stated wiring pattern connected electrically with a semiconductor element electrode has been formed;

(B) a semiconductor element bonded to the semiconductor-element-mounting substrate via an adhesive and connected electrically with the wiring pattern; and (C) an organic insulating encapsulant with which the semiconductor element is encapsulated at least at its electrode portion;

(D) the adhesive having an exothermic-reaction curing start temperature (Th) of 130° C. or below as measured with a differential scanning calorimeter (DSC) at a heating rate of 10° C./minute.

In the semiconductor device of the present invention, as the semiconductor-element-mounting substrate (A), used is a semiconductor-element-mounting substrate having an insulating base material on which a stated wiring pattern connected electrically with a semiconductor element electrode has been formed and having an external connecting terminal conducting to the wiring pattern, formed on the back which is opposite to the side on which the wiring pattern has been formed, and the organic insulating encapsulant (C) can be so applied as to encapsulate the whole of the semiconductor element (i.e., so applied that the semiconductor element surface is not uncovered).

The adhesive (D) may also preferably have a saturation moisture absorption of 0.18% by weight or less at 30° C. and 85% RH.

The present invention also provides a process for fabricating a semiconductor device; the process comprising the steps of;

bonding via an adhesive a semiconductor element to the surface of a semiconductor-element-mounting substrate having an insulating base material on which a wiring pattern has been formed, to connect an electrode of the semiconductor element electrically with the wiring pattern; and encapsulating with an organic insulating encapsulant the semiconductor element at least at its electrode portion;

the adhesive comprising an adhesive having an exothermic-reaction curing start temperature of 130° C. or below as measured with a differential scanning calorimeter at a heating rate of 10° C./minute.

The semiconductor device having the construction that the external terminals solder balls 10 are taken out from the surface of the semiconductor-mounting substrate as stated previously (FIG. 2) has an advantage that the multi-pin structure can be achieved with ease. However, it on the other hand has a problem that a warpage deformation tends to occur which starts from the center of the semiconductor device when it is cooled from molding temperature to room temperature or when the temperature is raised to reflow temperature, because of the fact that the semiconductor device has the construction of one-side encapsulation in shape and because of a great difference in values of physical properties between the semiconductor-element-mounting substrate and the organic insulating encapsulant 5.

Hence, a plurality of solder balls 10 having been so arranged as to be on the same plane on the semiconductor-mounting substrate come not to be arranged on the same plane as the semiconductor device undergoes a warpage deformation, to become different in height at some part. When this is tested in a packaging inspection step, a difficulty may arise in the connection of connectors to cause a trouble that no sufficient inspection can be made. Also, when such a semiconductor device is surface-mounted on a printed circuit board, some balls can not perfectly be connected to their corresponding wiring layers in the worst case, resulting in a low reliability at connection areas in some cases.

Accordingly, in the present invention, as the organic insulating encapsulant, it is preferable to use an encapsulant having a glass transition temperature between molding temperature and room temperature, having a difference of $0.6 \times 10^{-5}/°$ C. or above between the coefficient of linear expansion of the semiconductor-element-mounting substrate and the coefficient of linear expansion of the organic insulating encapsulant at a temperature not higher than the glass transition temperature, and having a curing shrinkage factor of 0.11% or less at the time of the molding of the organic insulating encapsulant.

Use of such an encapsulant can make cracking less occur when mounted by soldering and also can improve electrical interconnection reliability, preventing the semiconductor device from causing warpage deformation.

The organic insulating encapsulant may preferably have a saturation moisture absorption of 0.36% by weight or less at 85° C. and 85% RH. The organic insulating encapsulant may also preferably have a modulus in flexure of 4.0 GPa or below at the molding temperature of the organic insulating encapsulant.

BRIEF DESCRIPTION OF THE DRAWINGS

FIG. 4 is a graph showing the relationship between temperature and calorific value as measured with a differential scanning calorimeter (DSC), which represents curing behavior of an adhesive.

BEST MODES FOR PRACTICING THE INVENTION

As a result of detailed examination of a condition where the cracking or separation occurs when mounted by soldering, it has been found that such cracking or separation is chiefly caused by the water content absorbed as moisture and diffused from the back of the semiconductor-element-mounting substrate and from the organic insulating encapsulant and that this water content is easily accumulated in the voids of an adhesive layer to tend to cause the cracking or separation.

FIGS. 3A to 3D show semiconductor device fabrication steps where a semiconductor element 1 is mounted on the semiconductor-mounting substrate.

Figure 2:
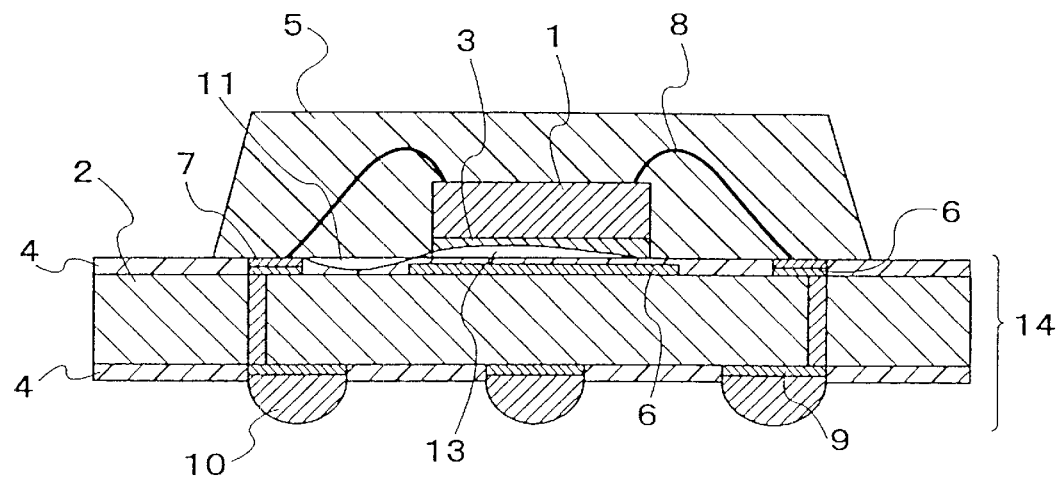
FIG. 2 is a cross-sectional view of a BGA semiconductor device having caused cracking at the time of reflowing.
Figure 3A:
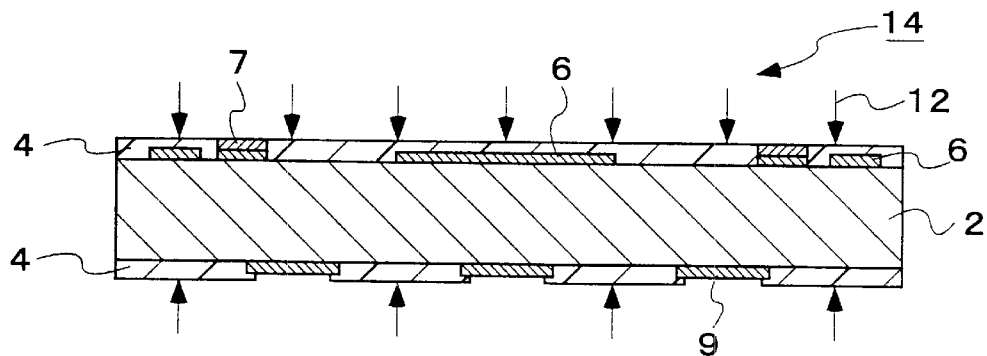
FIGS. 3A–3D are cross-sectional illustrations of semiconductor device fabrication steps where a semiconductor element is mounted on a semiconductor-mounting substrate.
Figure 3B:
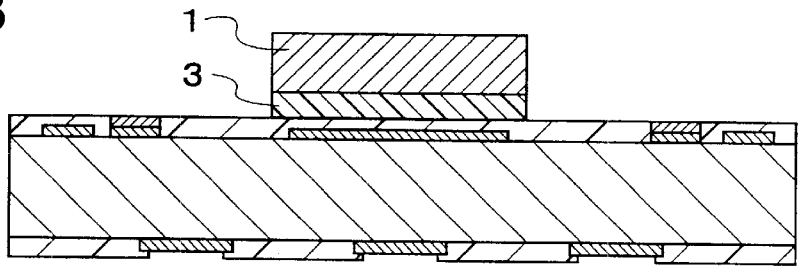
Figure 3C:
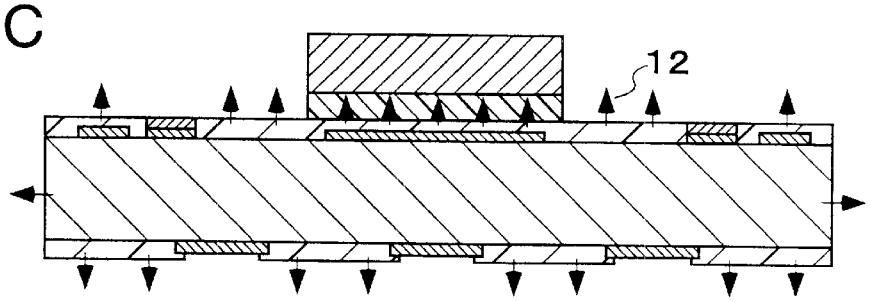
Figure 3D:
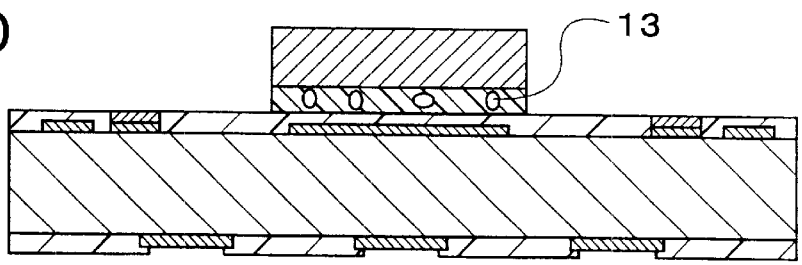

As shown in FIG. 3A, a semiconductor-mounting substrate 14 to be processed absorbs water content 12 as moisture from the atmosphere while it is left. Where a semiconductor element 1 is bonded to this substrate 14 via an adhesive 3 [FIG. 3B] and the device being in this step is heated in order to cure the adhesive 3, the water content 12 adsorbed as moisture from the surface of the semiconductor-mounting substrate vaporizes as shown in FIG. 3C. This water content 12 may enter the adhesive 3 layer before the adhesive is begun to cure, so that voids 13 are formed in a large number as shown in FIG. 3D.

Where the semiconductor device is fabricated using as it is the one having the voids 13 formed in the adhesive 3 layer, water content separately absorbed as moisture and diffused from the back of the semiconductor-mounting substrate and from the organic insulating encapsulant 5 may easily be accumulated in the voids 13 of the adhesive 3 layer. As the result, the cracking or separation 11 comes to tend to occur as shown in FIG. 2. The present invention is based on such a new finding.

FIG. 3A illustrates how the substrate 14 absorbs the water content 12 as moisture from the atmosphere while the semiconductor-mounting substrate 14 is left in the atmosphere. FIG. 3B is a cross-sectional view of the semiconductor-mounting substrate 14 on which the semiconductor element 1 has been mounted via the adhesive 3. FIG. 3C illustrates that the water content vaporizes from the surface of the semiconductor-mounting substrate 14 and enters the adhesive 3 layer while the substrate on which the element has been mounted, shown in FIG. 3B, is heated in an oven. FIG. 3D is a cross-sectional view showing that the voids 13 have been formed in the adhesive 3 layer after the heating step shown in FIG. 3C has been completed.

As stated above, the water content absorbed as moisture in the semiconductor-mounting substrate 14 comes to be the cause of forming the voids 13 in the adhesive 3 layer. Now, the values of moisture absorption of a semiconductor-mounting substrate 14 commonly used in an atmosphere of 30° C. and 60% RH are shown in Table 1. Here, the semiconductor-mounting substrate 14 is a substrate comprising an insulating base material which is constituted of an epoxy resin and a glass cloth and on both sides of which fine wiring patterns are provided and are further covered thereon with an insulating protective resist.

As can be seen from Table 1, the semiconductor-mounting substrate used in BGA packaging begins to absorb moisture rapidly, and its moisture absorption reaches more than 0.1% by weight in few hours or so. When in this stage the adhesive is applied and heated to cure in the same manner as that in conventional metallic-frame semiconductor devices (QFP and so forth), the water content vaporizes from the surface of the semiconductor-mounting substrate having absorbed as moisture the water content in the atmosphere, to enter the adhesive layer, and there is a possibility of causing voids in a large number.

TABLE 1

Substrate moisture absorption in atmosphere of 30° C./60%RH

| Time lapsed | Moisture absorption (wt. %) | Time lapsed | Moisture absorption (wt. %) |
| --- | --- | --- | --- |
| 1 hour | 0.06 | 6 hours | 0.13 |
| 2 hours | 0.09 | 8 hours | 0.15 |
| 4 hours | 0.12 | 16 hours | 0.18 |

Accordingly, in the present invention, the curing start temperature of the adhesive is appropriately set so that the adhesive can be cured at a low temperature before the water content having vaporized from the surface of the semiconductor-mounting substrate enters the adhesive layer, and thus the adhesive layer can be prevented from causing voids. More specifically, in the present invention, an adhesive having an exothermic-reaction curing start temperature (Th) of 130° C. or below as measured with a differential scanning calorimeter (DSC) at a heating rate of 10° C./minute is used as the adhesive.

Here, the curing start temperature (Th) indicates, as shown in FIG. 4, the temperature in the part of a reaction region of a DSC temperature/heat flow rate curve and at which the curve starts to rise abruptly, immediately before it reaches the maximum rate of heat flow. The adhesive starts to react and cure abruptly, from the point of time it has reached this temperature. Also, setting the Th to 130° C. or below not only enables achievement of the effect of less causing the voids, but also promises a superior short-time curability, and hence this is very effective also for improving production efficiency.

The adhesive used in the present invention may be of any types without any particular limitations as long as it has the curing performance described above. In order to keep the voids from being caused by the evaporation of a solvent contained in the adhesive, the adhesive may preferably be comprised of a base resin having a low viscosity and being of a solvent-free type. As the base resin, usable are acrylic resins, for example.

In order to control the quantity of water content accumulated in the adhesive layer after the semiconductor device has been fabricated, it is more preferable to use as the adhesive an adhesive having a saturation moisture absorption of 0.18% by weight or less under conditions of 30° C. and 85% RH.

Figure 5:
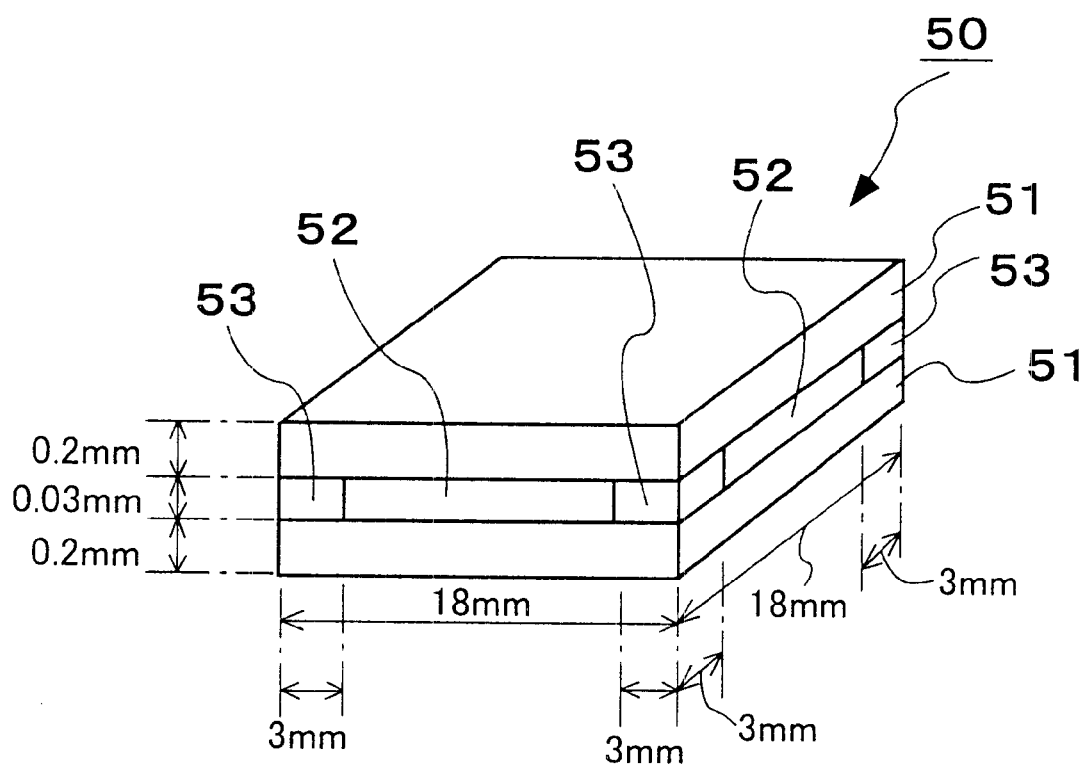
FIG. 5 is a perspective view of a sample used to measure the saturation moisture absorption of the adhesive.

Here, the saturation moisture absorption is measured in the following way: As shown in FIG. 5, an adhesive 52 to be measured is put between two sheets of sheet glass 51 of 18 mm long, 18 mm wide and 0.2 mm thick and with flat surfaces, and four sheets of aluminum foil of 3 mm long, 3 mm wide and 0.03 mm thick are used as spacers 53. In FIG. 5, the scale in thickness direction is arbitrarily altered so as to be seen with ease.

First, the mass (weight) of the sheet glass 51 and that of the aluminum foil (spacers 53) are accurately measured up to a figure of 0.01 mg. Next, 50 to 60 mg of the adhesive 52 is put between the two sheets of sheet glass 51 together with the spacers 53, and then cured at 180° C. for 1 hour. The mass of the resultant test piece is accurately measured up to a figure of 0.01 mg. Thereafter, in an atmosphere of 30° C. and 85% RH, the test piece is left to absorb moisture up to the lapse of 3,000 hours on which its mass comes to little change. The mass of the test piece after moisture absorption is accurately measured up to a figure of 0.01 mg. The saturation moisture absorption is a value SA calculated according to the following equation (1).

$$SA = \{(V_2 - V_1 - V_0)/(V_1 - V_0)\} \times 100 \quad (1)$$

SA: Saturation moisture absorption of the adhesive.
$V_0$: Mass of plate glass and aluminum foil.
$V_1$: Mass of the test piece before moisture absorption.
$V_2$: Mass of the test piece after moisture absorption.

The adhesive may preferably be those having an adhesive force as high as possible in order to prevent the adhesive from separating on the back of the semiconductor element or at the interface with the semiconductor-mounting substrate because of the vaporization and expansion of water content which are caused at the time of reflowing. In particular, those which do not greatly decrease in adhesive force as a result of moisture absorption are preferred.

The present inventors made further detailed examination on a condition where the warpage deformation occurs in the semiconductor device, and have discovered that the warpage deformation can be made less occur when an encapsulant having specific properties is used as the organic insulating encapsulant 5. The effect of making this warpage deformation less occur is explained below.

Figure 6:
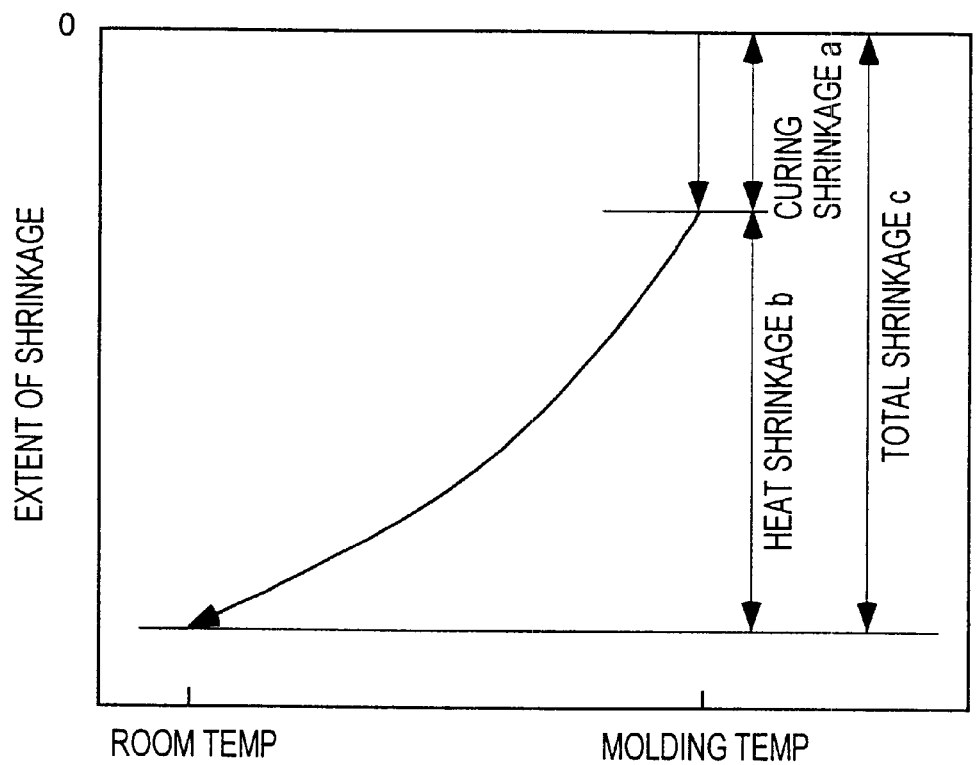
FIG. 6 is a graph showing the relationship between the temperature and the extent of shrinkage of an organic insulating encapsulant.

First, to elucidate the mechanism by which the warpage deformation occurs in BGA packaging, an example of a shrinkage curve of an organic insulating encapsulant at temperatures of from molding temperature to room temperature is shown in FIG. 6. Where an organic insulating encapsulant is heated in a mold to effect curing and then released from the mold to leave it cool, first the organic insulating encapsulant reacts to cure at molding temperature. At this stage, a shrinkage caused by the curing reaction (hereinafter "curing shrinkage a.") occurs. Next, when the molded product is released from the mold to leave it cool to room temperature, a shrinkage based on linear expansion of the organic insulating encapsulant (hereinafter "heat shrinkage b.") occurs. A shrinkage put together by adding the curing shrinkage a. and the heat shrinkage b. is total shrinkage c. of the organic insulating encapsulant.

Now, where the organic insulating encapsulant is molded on a semiconductor device of one-side encapsulation structure like BGA and there is a great difference between the total shrinkage c. of the organic insulating encapsulant and the coefficient of linear expansion of the semiconductor element and semiconductor-mounting substrate which are adjoining thereto, a residual stress is produced in the interior of the semiconductor device to cause warpage deformation over the whole semiconductor device.

In general, the warpage deformation of laminated structures occurs as a result of accumulation of residual stress in the interior of the structures. Hence, in order to reduce the warpage deformation, it is effective to relax the residual stress in the interior of the semiconductor device. Also, in order to relax the residual stress, it is effective to lower the modulus of elasticity of constituent members. In particular, it is effective for the organic insulating encapsulant to have a wide region of lowering of the modulus of elasticity in viscoelastic behavior within a temperature range of from room temperature to molding temperature, i.e., to have a glass transition temperature within this temperature range. With such a feature, it follows that the temperature region in which the modulus of elasticity of the organic insulating encapsulant lowers in a wide range is embraced in the temperature that is in the course of cooling to room temperature after package molding or in the course of raising temperature from room temperature in the step of solder reflowing. Thus, the residual stress produced in the device can be relaxed and the warpage deformation can effectively be made to less occur.

Accordingly, in the present invention, it is preferable to appropriately use as the organic insulating encapsulant an encapsulant having a glass transition temperature in the temperature range of from room temperature to molding temperature. This is because the use of such an encapsulant enables the warpage deformation to less occur on the level of semiconductor devices. Incidentally, the lower limit of the modulus of elasticity thus lowered may preferably be about 1/10 of the modulus of elasticity at room temperature. Molding temperature may preferably be within the range of from 170 to 180° C., but is not particularly limited thereto as long as it is within a temperature range in which the molding properties of the organic insulating encapsulant are not damaged.

The substrate and the encapsulant may also be used in appropriate combination so that the semiconductor-mounting substrate and the organic insulating encapsulant may have a difference in heat shrinkage within a stated range. This enables relaxation of the residual stress to make small the warpage deformation on the level of semiconductor devices.

As a result of extensive studies, the present inventors have discovered that, taking account of the influence of the semiconductor element mounted on the inner-wall side of the organic insulating encapsulant and the extent of total shrinkage of the curing shrinkage and heat shrinkage put together, the organic insulating encapsulant may preferably have a difference in coefficient of linear expansion, of $0.6 \times 10^{-5}/°$ C. or above between the semiconductor-mounting substrate and the organic insulating encapsulant at a temperature not higher than the latter's glass transition temperature. This can effectively lower the extent of warpage deformation at the time of the cooling from molding temperature to room temperature.

The present inventors have also discovered that the use of an organic insulating encapsulant having a specific value of extent of curing shrinkage at the time of molding can make small the warpage deformation on the level of semiconductor devices. Accordingly, in the present invention, it is preferable to use an organic insulating encapsulant having a curing shrinkage factor of 0.11% or less.

An encapsulant which undergoes curing shrinkage at an appropriate extent not only can make the total shrinkage of the organic insulating encapsulant appropriate in extent against the warpage deformation caused when it is cooled from molding temperature to room temperature, but also can make the warpage deformation as small as possible at the temperature (in general, around molding temperature of about 170–180° C.) at which the solder begins to melt at the time of solder reflowing, to contribute to an improvement in the reliability of connection with a substrate for mounting.

Here, the curing shrinkage factor is a value dP obtained in the following way: A test piece constituted of a single member of 60.1 mm long, 6 mm wide and 1.5 mm thick is molded, and fist the molding cavity size in the longitudinal direction at molding temperature and the test piece size in the longitudinal direction at room temperature immediately after molding are accurately measured with a precision slide caliper up to a figure of 0.01 mm, and a shrinkage factor dL of the whole is calculated according to the following equation (2). Thereafter, a heat shrinkage factor dT at temperatures of from molding temperature to room temperature separately measured is subtracted from this value dL according to the following equation (3) to calculate the value dP.

$$dL=(L_0-L)/L_0 \qquad (2)$$

dL: Molding shrinkage factor of the whole.
$L_0$: Molding cavity size at molding temperature.
L: Test piece size at room temperature.

$$dP=dL-dT \qquad (3)$$

dP: Curing shrinkage factor.
dL: Molding shrinkage factor of the whole.
dT: Heat shrinkage factor.

In the present invention, in order to control the quantity of water content diffused from the organic insulating encapsulant to the adhesive layer, it is preferable to use an organic insulating encapsulant having a saturation moisture absorption of 0.36% by weight or less at 85° C. and 85% RH.

Here, the saturation moisture absorption is a value obtained in the following way: A disk (according to JIS-K6911) constituted of a single member of 50 mm diameter and 3 mm thick is dry-treated at 120° C. for 2 hours as pretreatment, and then its mass (weight) is accurately measured up to a figure of 1 mg. Thereafter, in an atmosphere of 85° C. and 85% RH, the test piece is left to absorb moisture up to the lapse of 3,000 hours on which its mass comes not to change any longer. The mass of the test piece after moisture absorption is accurately measured up to a figure of 1 mg. The saturation moisture absorption is a value SM calculated according to the following equation (4).

$$SM=\{(W_2-W_1)/W_1\}\times100 \qquad (4)$$

SM: Saturation moisture absorption of the organic insulating encapsulant.
$W_1$: Mass of the test piece before moisture absorption.
$W_2$: Mass of the test piece after moisture absorption.

In the step of solder reflowing, in order to further relax the residual stress in the interior of the semiconductor device when connected with a printed circuit board, the organic insulating encapsulant may also preferably have a modulus in flexure of 4.0 GPa or below at a temperature at which the solder begins to melt, i.e., about the molding temperature. Here, the modulus in flexure is a value obtained by making a three-point bending test on a test piece (according to JIS-K6911) constituted of a single member of 70 mm long, 10 mm wide and 3 mm thick, and calculated according to the following equation (5).

$$E=(I \cdot \Delta P)/(4wh \cdot \Delta y) \qquad (5)$$

E: Modulus in flexure I: Span
ΔP: Load w: Lateral length of the test piece
Δy: Displacement h: Height of the test piece As the base resin of the organic insulating encapsulant, those composed chiefly of an epoxy resin having a biphenyl skeleton are preferred in view of an advantage that the effect of especially great viscoelastic properties is obtainable within a temperature range of from molding temperature to room temperature. In the organic insulating encapsulant, a material having a rigid structure that can make any free volumetric change small after curing may preferably be mixed for the purpose of reducing the curing shrinkage factor. A filler mixed in the organic insulating encapsulant may preferably be in an amount not less than 80% by volume in view of the controlling of heat shrinkage factor and moisture absorption.

As the insulating base material, usable are, e.g., organic insulating base materials. Composite materials comprised of a reinforcing material such as glass cloth impregnated with a synthetic resin such as epoxy resin, polyimide or phenolic resin may be used, and besides synthetic resin films such as TAB (tape automated bonding) tape materials maybe used. As the insulating base material, those having a moisture absorption as low as possible may preferably be used so that any voids can be kept from being caused in the adhesive layer in the course of the curing of the adhesive and also the water content can be kept from being diffused from this base material member to the adhesive layer after the fabrication of semiconductor devices.

The present invention will be described below in a specific manner by giving Examples. The present invention is by no means limited to these.

EXAMPLE 1

Figure 1:
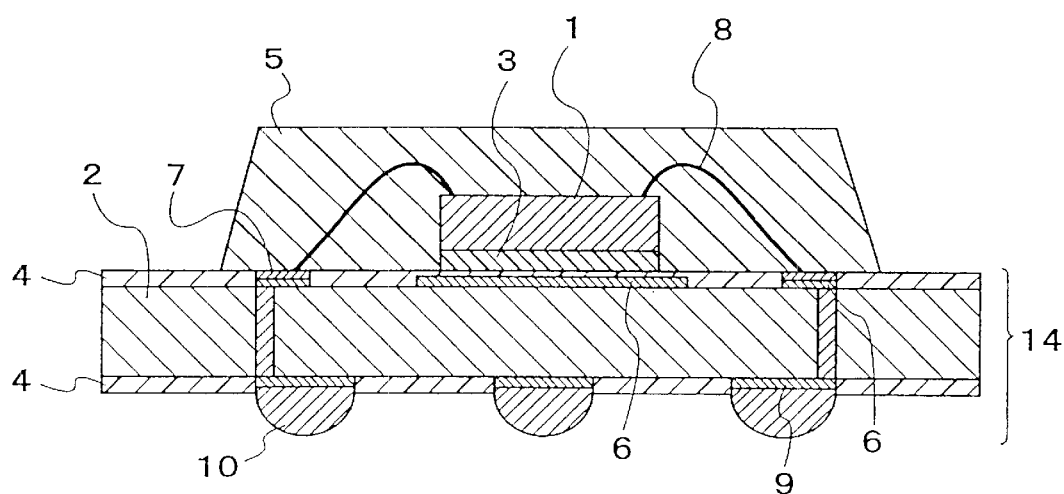
FIG. 1 is a cross-sectional illustration of the construction of the semiconductor device of the present invention.

A semiconductor-element-mounting substrate having an external size of 26.2 mm long, 26.2 mm wide and 0.6 mm thick having, as shown in FIG. 1, an insulating base material 2 (a glass cloth-epoxy resin laminated sheet available from Hitachi Chemical Co., Ltd.; trade name: E-679) on which fine wiring patterns 6 were formed and an insulating protective resist 4 (available from Taiyo Inki K. K.; trade name: PSR4000 AUS5) was coated on the surface except for gold-plated terminals 7 and opposite-side external connecting terminals 9, was dried at 120° C. for 2 hours and then left for 5 hour in an atmosphere of 30° C. and 60% RH. Thereafter, a semiconductor element 1 of 9 mm long, 9 mm wide and 0.51 mm thick was mounted thereon, coating an adhesive 3 (available from Hitachi Chemical Co., Ltd.; trade name: EN-X50), followed by heating in an clean oven for 1 hour from room temperature to 180° C. at a constant heating rate, and further followed by heating for 1 hour at a constant temperature of 180° C.

Thereafter, wire bonding portions and semiconductor element electrodes were wire-bonded through gold wires 8 of 30 µm in diameter. Next, using an organic insulating encapsulant 5 (available from Hitachi Chemical Co., Ltd.; trade name: CEL-X9600), the semiconductor element mounted area was encapsulated by transfer molding under conditions of 175° C., 90 seconds, and 6.9 MPa, followed by post-curing under conditions of 175° C. and 5 hours to obtain a BGA semiconductor device.

EXAMPLE 2

A BGA semiconductor device was obtained in the same manner as in Example 1 except that a different adhesive (available from Hitachi Chemical Co., Ltd.; trade name: EN-X52) was used.

EXAMPLE 3

A BGA semiconductor device was obtained in the same manner as in Example 1 except that CEL-9000 (trade name), available from Hitachi Chemical Co., Ltd., was used as the organic insulating encapsulant. In the present Example, the difference between the coefficient of linear expansion of the semiconductor-element-mounting substrate and the coefficient of linear expansion of the organic insulating encapsulant at a temperature not higher than the glass transition temperature is less than $0.6 \times 10^{-5}$/° C.

EXAMPLE 4

A BGA semiconductor device was obtained in the same manner as in Example 1 except that CEL-7700SX (trade name), available from Hitachi Chemical Co., Ltd., was used as the organic insulating encapsulant. The encapsulant used in the present Example had a curing shrinkage factor more than 0.11% and a saturation moisture absorption of more than 0.36% by weight at 85° C. and 85% RH.

EXAMPLE 5

A BGA semiconductor device was obtained in the same manner as in Example 1 except that CEL-1731 (trade name), available from Hitachi Chemical Co., Ltd., was used as the organic insulating encapsulant. The encapsulant used in the present Example had a glass transition temperature at the molding temperature or above, where the difference between the coefficient of linear expansion of the semiconductor-element-mounting substrate and the coefficient of linear expansion of the organic insulating encapsulant at a temperature not higher than the glass transition temperature is less than $0.6 \times 10^{-5}$/° C. The encapsulant had a modulus in flexure above 4.0 GPa at its molding temperature, and a saturation moisture absorption more than 0.36% by weight at 85° C. and 85% RH.

EXAMPLE 6

A BGA semiconductor device was obtained in the same manner as in Example 1 except that an adhesive (available from Hitachi Chemical Co., Ltd.; trade name: EN-4570) having a saturation moisture absorption of 0.18% by weight or more at 30° C. and 85% RH was used as the adhesive.

COMPARATIVE EXAMPLE 1

A BGA semiconductor device was obtained in the same manner as in Example 3 except that an adhesive (available from Hitachi Chemical Co., Ltd.; trade name: EN-4500) having a curing start temperature (Th) above 130° C. was used as the adhesive.

Physical properties, resistance to reflow cracking, and warpage deformation of Examples and Comparative Examples were examined to obtain the results shown in Table 2.

Here, the curing start temperature (Th) of the adhesive was measured with a differential scanning calorimeter (manufactured by TA Instruments Japan Inc.; trade name: Model 910) at a heating rate of 10° C./minute. The glass transition temperature of the organic insulating encapsulant was measured with a thermomechanical analyzer (manufactured by Rigaku International Corporation; trade name: TMA-8141BS, TAS-100).

Evaluation on the resistance to reflow cracking and warpage deformation was made in the following way.

(1) Resistance to Reflow Cracking:

The semiconductor device was moistened for a stated time under conditions of 85° C. and 60% RH, and thereafter reflow-treated three times at 240° C. for 10 seconds in an infrared reflow furnace. Any voids and cracking or separation of the adhesive layer, having-occurred in the interior of the semiconductor device were observed with an ultrasonic inspection device. Those in which the cracking or separation extended up to the gold-plated-terminal regions were regarded as defectives (number of defectives was written as a numerator, and number of test devices as a denominator).

(2) Warpage Deformation:

Measured at the diagonal-line central part on the back of a semiconductor device standing after mount of the semiconductor element and before mount of the solder balls. In the room temperature region, values at 25° C. were measured with a surface profile analyzer, and, in the molding temperature region, values at 175° C. were measured with a non-contact laser analyzer. Then, an average value (the number of samples: 4) of maximum values of the extent of deformation on the basis of that of the outermost external connecting terminals was shown as the extent of warpage deformation.

As can be seen from Table 2, the semiconductor devices of Examples 1 to 5 all did not cause any voids in their adhesive layers. In particular, Examples 1 to 3 showed a remarkable improvement in the resistance to reflow cracking. On the other hand, in Comparative Example 1, making use of an adhesive having a high curing start temperature (Th), voids occurred in the adhesive layer.

In Examples 1 and 2, making use of suitable encapsulants, not only any voids did not occur in the adhesive layer, but also the warpage deformation at both 25° C. and 175° C. was able to be kept at a small extent. More specifically, in these Examples, a high resistance to reflow cracking was achievable on account of a low moisture absorption of the organic insulating encapsulant, and a small extent of warpage deformation was achievable on account of the glass transition temperature of the organic insulating encapsulant, the difference in the coefficient of linear expansion between the encapsulant and the semiconductor-element-mounting substrate, the modulus in flexure at molding temperature and the curing shrinkage factor which were set appropriate, thereby obtaining good semiconductor devices which satisfied the standard of within plus-minus 150 $\mu$m prescribed in JEDEC (Joint Electron Device Engineering Council).

POSSIBILITY OF INDUSTRIAL APPLICATION

As described above, the present invention makes it possible to provide a semiconductor device that may less cause cracking at the time of solder reflowing. It also makes it possible to provide an OMPAC type BGA packaged semiconductor device that can prevent occurrence of warpage deformation. Hence, the use of the semiconductor device of the present invention enables reduction of faulty electrical connection, promising a great industrial value.

What is claimed is:

1. A semiconductor device comprising:
   a semiconductor-element-mounting substrate having an insulating base material on which a wiring pattern has been formed;
   a semiconductor element having an electrode, and bonded to the semiconductor-element-mounting substrate with an adhesive; said electrode being connected electrically with said wiring pattern; and
   an organic insulating encapsulant encapsulating at least said electrode; wherein said organic insulating encapsulant has the following properties:
      a glass transition temperature between molding temperature and room temperature;
      a difference of $0.6 \times 10^5/°$ C. or above between the coefficient of linear expansion of said semiconductor-element-mounting substrate and the coefficient of linear expansion of said organic insulating encapsulant at a temperature not higher than the glass transition temperature;
      a curing shrinkage factor of 0.11% or less at the time of the molding of said organic insulating encapsulant;
      a saturation moisture absorption of 0.36% by weight or less at 85° C. and 85% RH; and
      a flexural modulus of 4.0 GPa or below at the molding temperature of the organic insulating encapsulant;
   said adhesive having an exothermic-reaction curing start temperature of 130° C. or below as measured with a differential scanning calorimeter at a heating rate of 10° C./minute, and
   said adhesive having a saturation moisture absorption of 0.18% by weight or less at 30° C. and 85% RH.

2. The semiconductor device according to claim 1, wherein;
   said semiconductor-element-mounting substrate has an external connecting terminal conducting to the wiring pattern, formed on the back which is opposite to the side on which the wiring pattern has been formed; and
   said organic insulating encapsulant so encapsulates the semiconductor element that a surface of said semiconductor element is not uncovered.

3. A process for fabricating a semiconductor device, comprising the steps of;
   bonding with an adhesive a semiconductor element to the surface of a semiconductor-element-mounting substrate having an insulating base material on which a wiring pattern has been formed, to connect an electrode of the semiconductor element electrically with the wiring pattern; and
   encapsulating at least said electrode of the semiconductor element with an organic insulating encapsulant;
   wherein said organic insulating encapsulant has the following properties:
      a glass transition temperature between molding temperature and room temperature;
      a difference of $0.6 \times 10^5/°$ C. or above between the coefficient of linear expansion of said semiconductor-element-mounting substrate and the coefficient of linear expansion of said organic insulating encapsulant at a temperature not higher than the glass transition temperature;
      a curing shrinkage factor of 0.11% or less at the time of the molding of said organic insulating encapsulant;
      a saturation moisture absorption of 0.36% by weight or less at 85° C. and 85% RH; and
      a flexural modulus of 4.0 GPa or below at the molding temperature of the organic insulating encapsulant;
   said adhesive comprising an adhesive having an exothermic-reaction curing start temperature of 130° C. or below as measured with a differential scanning calorimeter at a heating rate of 10° C./minute and a saturation moisture absorption of 0.18% by weight or less at 30° C. and 85% RH.

* * * * *